United States Patent
Johnson

(10) Patent No.: US 7,456,070 B2
(45) Date of Patent: Nov. 25, 2008

(54) METHOD OF FABRICATING A BIPOLAR TRANSISTOR WITH HIGH BREAKDOWN VOLTAGE COLLECTOR

(75) Inventor: Frank S. Johnson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1777 days.

(21) Appl. No.: 10/329,783

(22) Filed: Dec. 27, 2002

(65) Prior Publication Data
US 2004/0000694 A1    Jan. 1, 2004

Related U.S. Application Data

(62) Division of application No. 09/196,375, filed on Nov. 19, 1998, now Pat. No. 6,570,242.

(60) Provisional application No. 60/067,086, filed on Nov. 20, 1997.

(51) Int. Cl.
*H01L 21/8222* (2006.01)
*H01L 21/8238* (2006.01)
*H01L 21/331* (2006.01)

(52) U.S. Cl. .............. 438/340; 438/202; 438/205; 438/309; 438/234; 438/370

(58) Field of Classification Search ............... 257/378, 257/370, 593, 565, 656; 438/234, 309, 202, 438/205, 313, 340, 352, 358, 376, 350, 370
See application file for complete search history.

(56) References Cited

U.S. PATENT DOCUMENTS

| 4,644,383 A | 2/1987 | Akcasu ................. 257/593 |
| 5,014,106 A | 5/1991 | Maeda et al. ............. 257/593 |

FOREIGN PATENT DOCUMENTS

| JP | 2-312243 | 12/1990 | .......... 257/593 |
| WO | WO 97/17726 | * 5/1997 | |

* cited by examiner

*Primary Examiner*—Shouxiang Hu
(74) *Attorney, Agent, or Firm*—Wade James Brady, III; Frederick J. Telecky, Jr.

(57) ABSTRACT

A method of fabricating a transistor that includes a doped buried region within a semiconductor body. The doped buried region includes a portion having a first thickness and a second thickness, the first thickness being less than the second thickness. In one embodiment, the first thickness is about half the second thickness. The transistor also includes a collector region over the buried region, a base region within the collector region and an emitter region within the base region.

8 Claims, 7 Drawing Sheets

METHOD OF FABRICATING A BIPOLAR TRANSISTOR WITH HIGH BREAKDOWN VOLTAGE COLLECTOR

CROSS REFERENCE TO PRIOR APPLICATIONS

This application is a division of Ser. No. 09/196,375 filed Nov. 19, 1998 now U.S. Pat. No. 6,570,242 which claims priority based upon Provisional Application Ser. No. 60/067,086, filed Nov. 20, 1997.

FIELD OF THE INVENTION

This invention relates to semiconductor devices, and more specifically to bipolar transistors.

BACKGROUND OF THE INVENTION

Bipolar transistors are commonly used in semiconductor devices, especially for high-speed operation and large drive current applications. A double polysilicon bipolar transistor 10 is shown in FIG. 1. The active area for the transistor is isolated by shallow trench isolation regions 12. The collector 13 is a lightly doped region of one conductivity type in epitaxial layer 14, and the base region is formed by doped regions 16 and 18 of the opposite conductivity type. A heavily doped buried layer 15 lies beneath the collector 13 and is doped the conductivity type of the collector. Doped region 16 is called the intrinsic base region because it lies directly between the emitter and collector of the transistor. Region 18, on the other hand, is known as the extrinsic base region. The extrinsic base region 18 provides an area for connecting to the base of the transistor. The base electrode 20 comprises a first doped polysilicon layer. The emitter region 22 is a doped region of the same conductivity type as the collector and is located within the intrinsic base region 16. The emitter electrode 24 is formed with a second doped polysilicon layer. Contact to the buried layer 15 is made by a heavily-doped collector contact implanted region 28. Oxide region 26 and base-emitter spacers 28 insulate the emitter electrode 24 from the base electrode 20.

The design of the collector of a bipolar transistor influences both its breakdown and high-frequency characteristics. In general a thicker, more lightly-doped collector provides a higher collector-emitter breakdown voltage (BVceo), whereas a thinner, more heavily-doped collector reduces base pushout (Kirk effect) and provides a higher cutoff frequency ($f_T$). Much emphasis has been placed on improving $f_T$ in the prior art. For example, in Japanese Patent Application No. 63-154721 a recess is etched in the epitaxial layer in which the collector and base are formed to thin the collector layer between the intrinsic base and a buried layer. In another approach, a phosphorus implant beneath the intrinsic base suppresses base pushout and improves $f_T$. See Sugiyama, et al., "A 40 GHz $f_T$ Si Bipolar Transistor LSI Technology," 1989 IEEE International Electron Devices Meeting Technical Digest, 9.1.1. These techniques, however, result in transistors with low BVceo. The Sugiyama paper, for example, reports a BVceo of only 3.3 Volts.

In contrast, the prior art transistor shown in FIG. 2 is designed for high BVceo. The transistor is identical to that of FIG. 1, except that the n+ buried layer is omitted. This, however, increases both the vertical and horizontal components of the collector resistance. High collector resistance can result in the transistor going into saturation at high collector currents, which can induce latchup by injecting holes into the substrate.

The BVceo and $f_T$ of a bipolar transistor have traditionally been subject to a performance trade-off. In other words, transistors designed to operate as power devices typically do not perform well in applications requiring small-signal amplification, whereas transistors designed to amplify small signals typically do not perform well in high-power conditions. As a result, the integrated circuit designer is often forced to compromise or trade off the performance of one type of circuit (e.g. input/output) in the integrated circuit against another type of circuit (e.g. small signal amplifier). Therefore, a need exists for structures and methods that allow for transistors designed for both high BVceo and high $f_T$ to be formed on the same monolithic integrated circuit. It is also desirable that both types of transistors be formed in a cost-effective manner without added process steps.

In typical double polysilicon bipolar transistors, the emitter junction 22 in FIG. 1 is formed by implantation and subsequent diffusion of a dopant from the polysilicon contact 24. A fraction of the emitter dopant implant is blocked from reaching the polysilicon contacting the single-crystal silicon region by the portion of the polysilicon contact 24 deposited on the vertical surface of the base-emitter spacer 28. Since the average dose of dopant diffusing through the polysilicon-silicon interface along the entire length of the emitter surface is a function of the ratio of the width of the implanted planar fraction of the polysilicon to the width of the non-implanted polysilicon on the vertical surface of the base-emitter spacers, the emitter diffusion profile and average junction depth becomes a function of the lithographically-defined emitter width. This effect is typically most severe for extremely narrow emitters with lithographically-defined widths less than approximately four times the thickness of the polysilicon contact 24. In this case, the gain of the transistor also becomes a function of the emitter width and the transistor is said to suffer from narrow-emitter effects.

In order to achieve a consistent gain for all the transistors used within a circuit, it is desired that this emitter diffusion 22 extend an equal distance into the single-crystalline silicon for all bipolar transistors on a single silicon substrate, independent of the dimensions of the lithographically-defined emitter region. One method of achieving this size independence of the emitter junction and the transistor gain is by forming an "L"-shaped base-emitter spacer that allows the volume of the vertically-deposited emitter polysilicon to reside within the "L" and outside of the region above the active emitter. This situation allows an implanted region to be formed directly above the entire length of the emitter junction. An additional advantage to the use of an "L"-shaped spacer is that the width of the planar portion of polysilicon located directly above the intrinsic emitter region becomes larger for a given patterned emitter size. This increases the area for creating a low-resistance emitter contact and reduces the susceptibility of the contact to being fully or partially blocked by parasitic spacers formed in the emitter contact region during subsequent CMOS source-drain spacer processing steps.

The "L" spacer is typically formed by the low-pressure chemical vapor deposition (LPCVD) of a stack film of oxide/nitride/oxide and a combination of selective wet and dry etching of the layers. However, the dimensions of an "L"-shaped spacer formed by this method are limited by the etching selectivities between the LPCVD oxide, LPCVD nitride, and a previously-formed thermal oxide layer. Typically, an "L"-shaped spacer with a thin enough body to completely contain the vertically-deposited polysilicon cannot be reliably manufactured. A need exists for a fabrication method to form thin-bodied "L"-shaped spacers reliably.

SUMMARY OF THE INVENTION

In accordance with an embodiment of the invention, there is disclosed a transistor which includes a doped buried region within a semiconductor body. The doped buried region includes a portion having a first thickness and a second thickness, the first thickness being less than the second thickness. In one embodiment the first thickness is about half the second thickness. The transistor also includes a collector region over the buried region, a base region within the collector region, and an emitter region within the base region.

In accordance with another embodiment of the invention, there is disclosed an integrated circuit including a first transistor including a first doped buried region within a semiconductor body. The first doped buried region includes a portion having a first thickness and a second thickness, the first thickness being less than the second thickness. The integrated circuit further includes a second transistor. The second transistor has a second doped buried region with the semiconductor body, the second doped buried region being substantially uniform in thickness. The integrated circuit may also include CMOS p-channel and n-channel transistors.

In accordance with still another embodiment of the invention, there is disclosed a method for making a transistor. The method includes the steps of masking the surface of a semiconductor body to cover an intrinsic region, doping unmasked regions of the surface to form a plurality of diffusion source regions, and diffusing dopants from the diffusion source regions to form a doped buried region having a first thickness and a second thickness, the first thickness being less than the second thickness in the intrinsic region. The method also includes the steps of forming a collector region over the doped buried region, forming a base region within said collector region, and forming an emitter region within said base region.

An advantage of the inventive concepts is that bipolar transistors having relatively high breakdown characteristics may be integrated with bipolar transistors having a relatively high cutoff frequency with no added process costs.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 1:
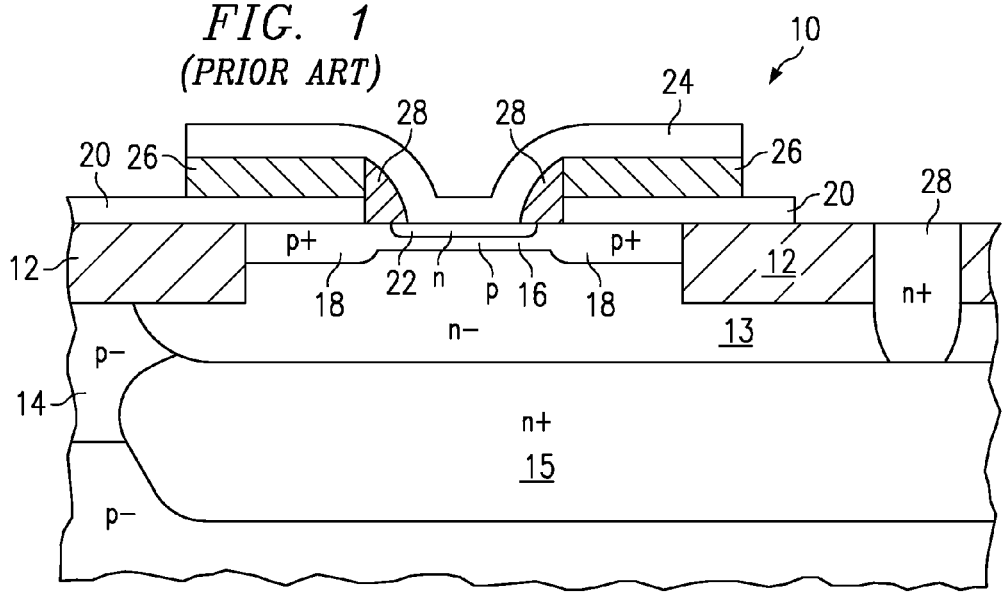
FIG. 1 is a cross-sectional diagram of a prior art double polysilicon bipolar transistor.
Figure 2:
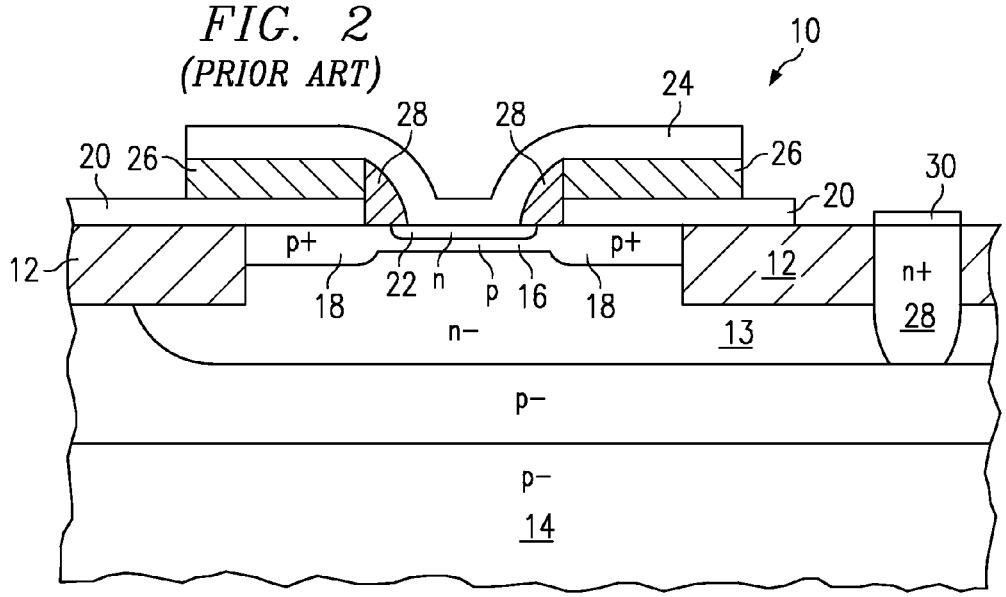
FIG. 2 is a cross-sectional diagram of a prior art double polysilicon bipolar transistor designed for high breakdown voltage characteristics.
Figure 3A:
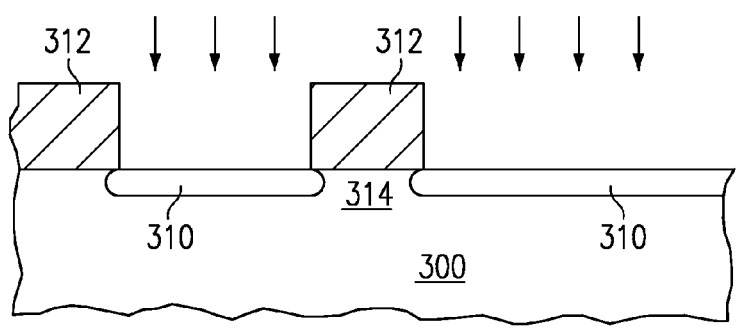
FIGS. 3a to 3n are cross-sectional diagrams of a transistor in accordance with a first embodiment of the invention at various stages during fabrication.
Figure 3B:
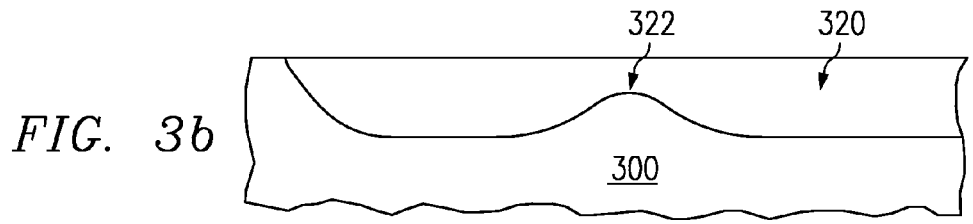
Figure 3C:
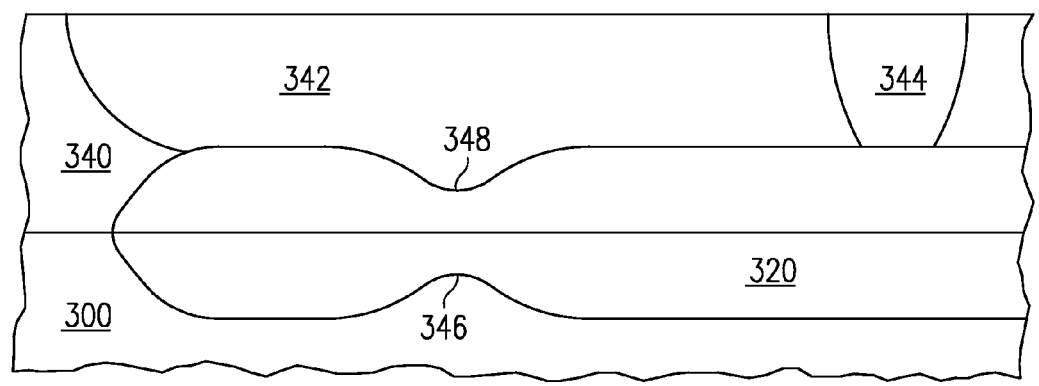
Figure 3D:
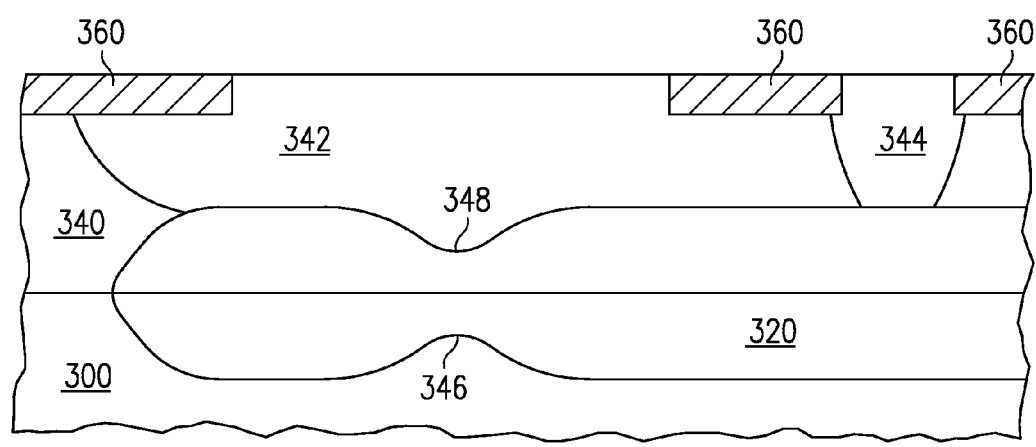
Figure 3E:
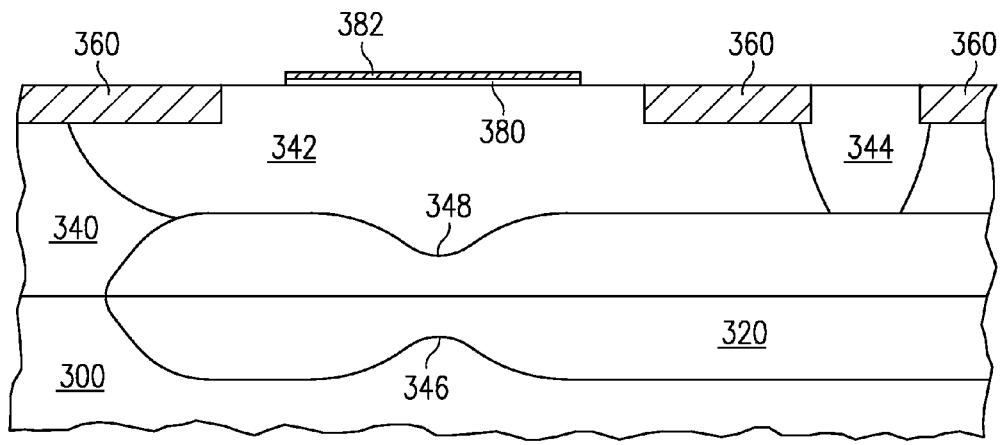
Figure 3F:
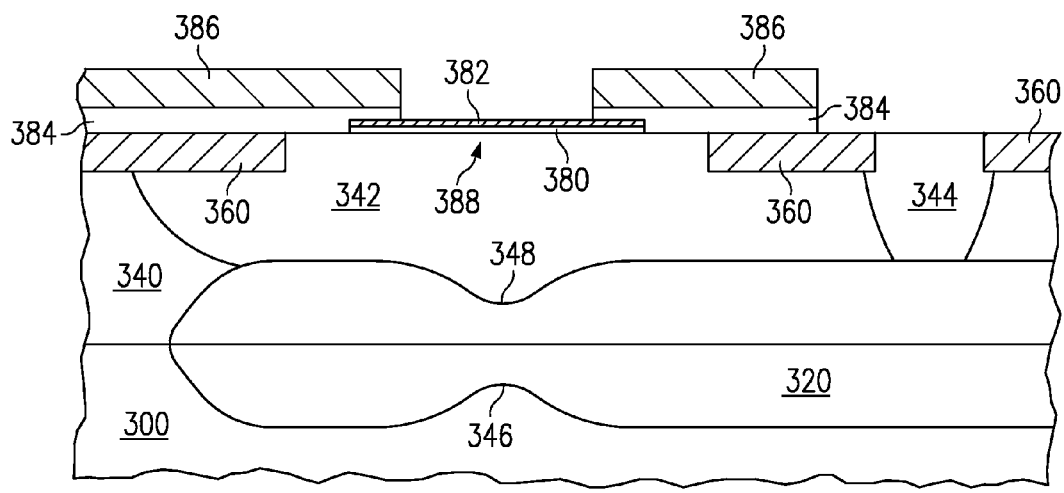
Figure 3G:
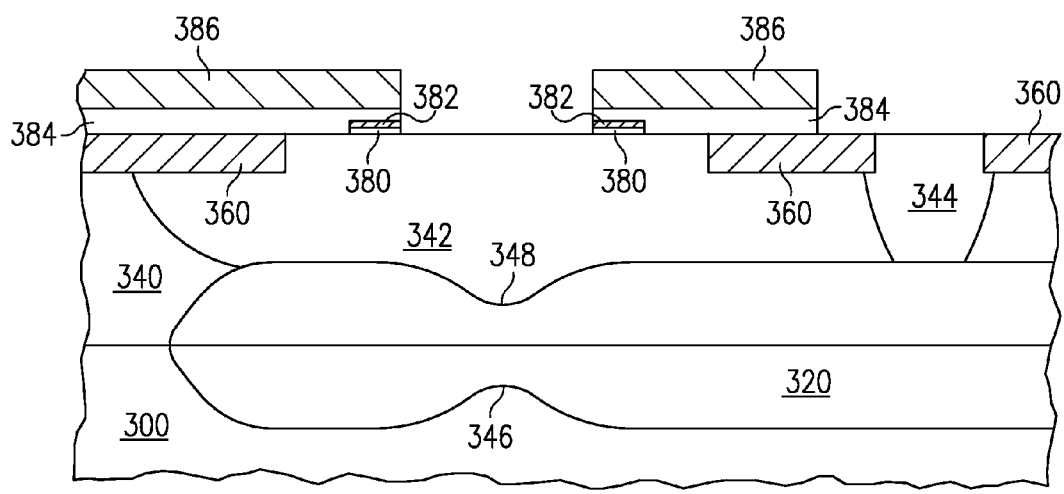
Figure 3H:
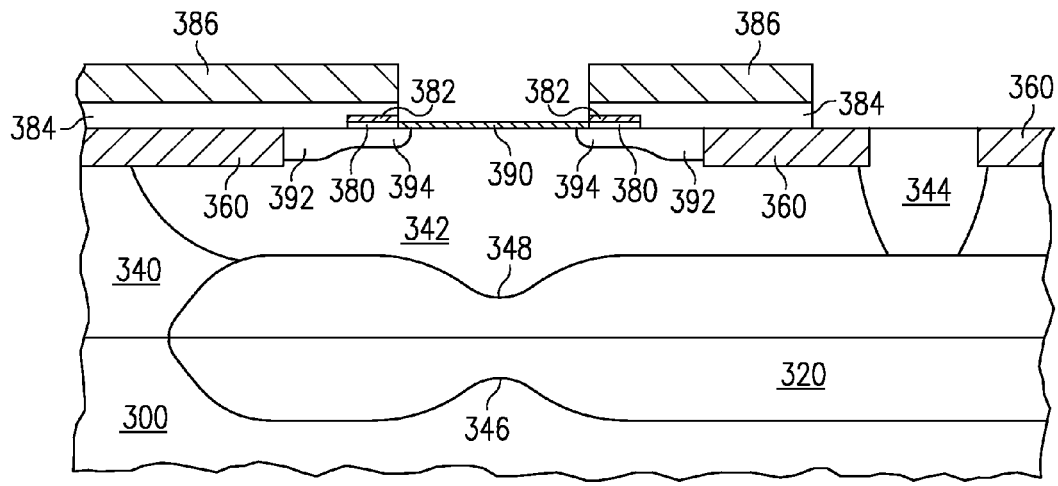
Figure 3I:
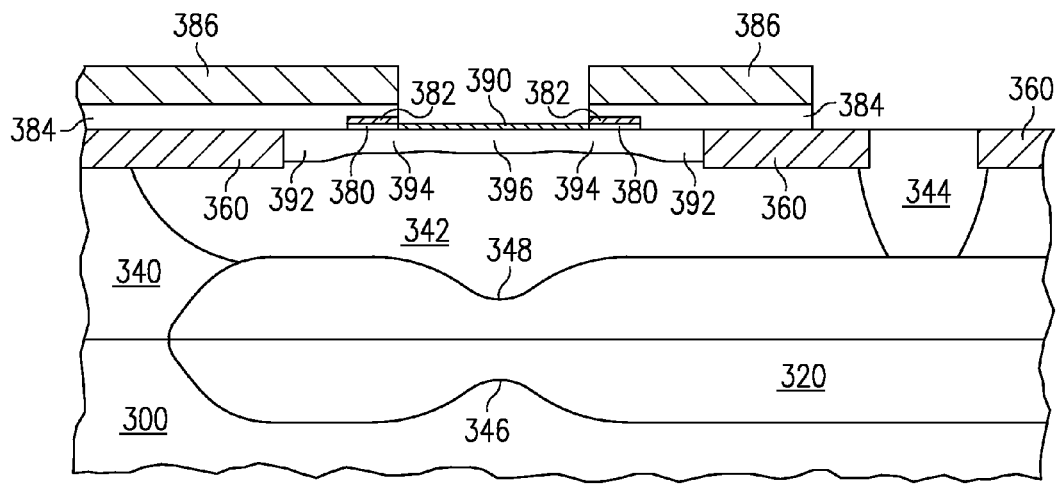
Figure 3J:
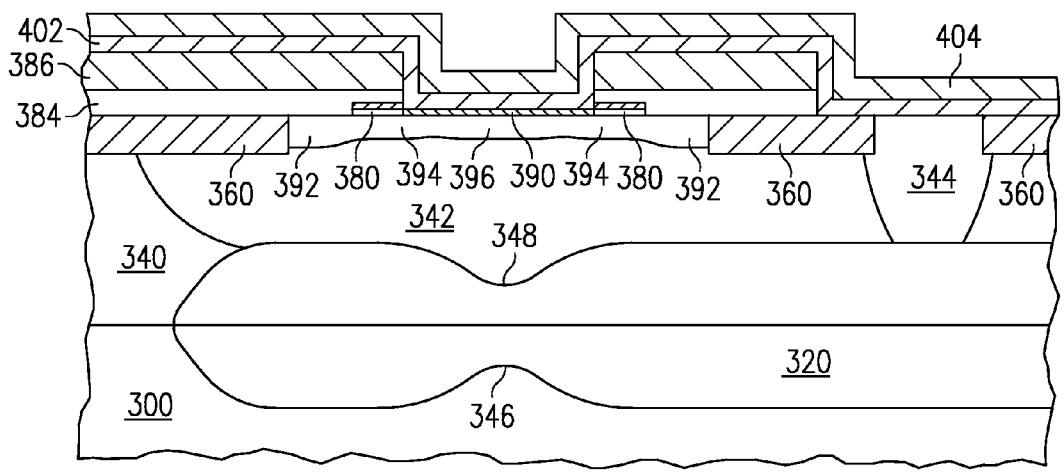
Figure 3K:
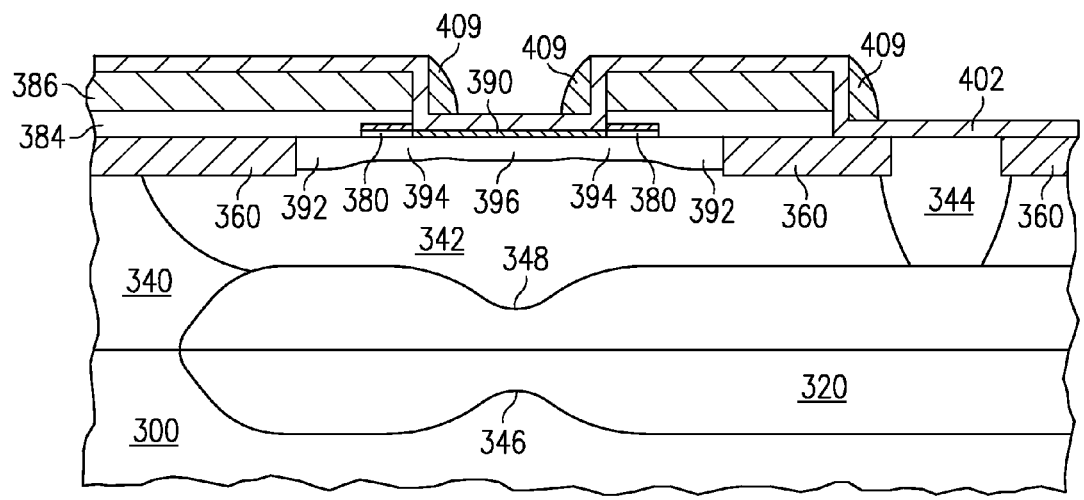
Figure 3L:
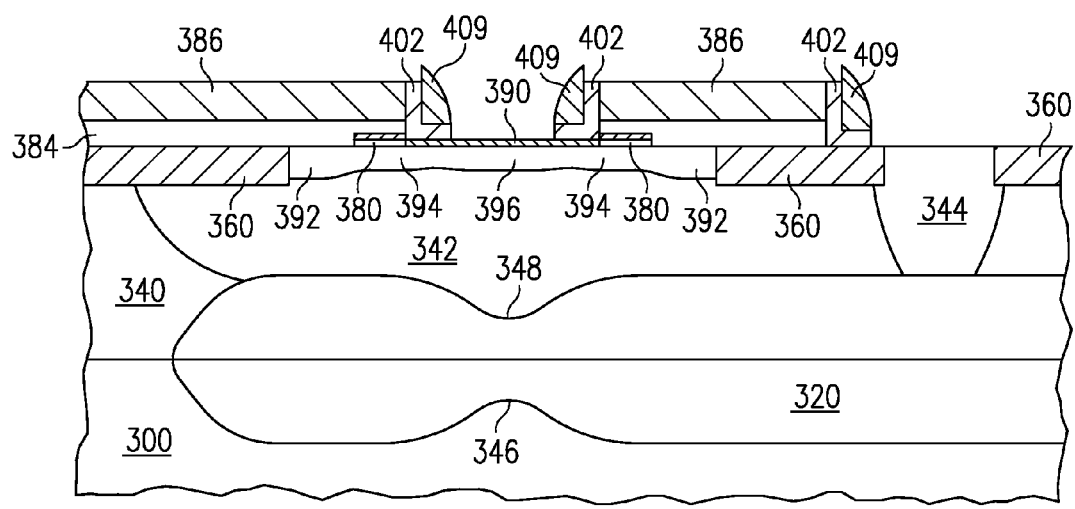
Figure 3M:
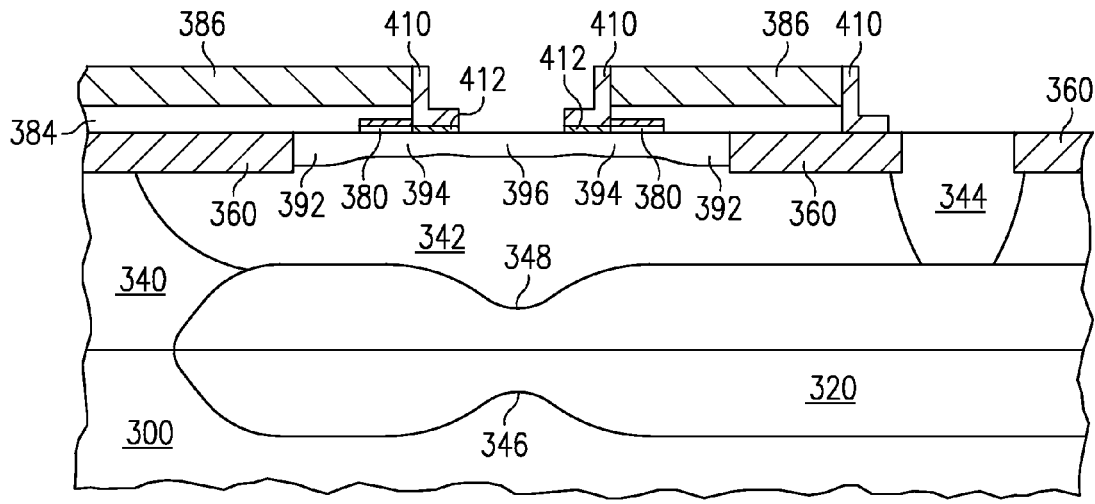
Figure 3N:
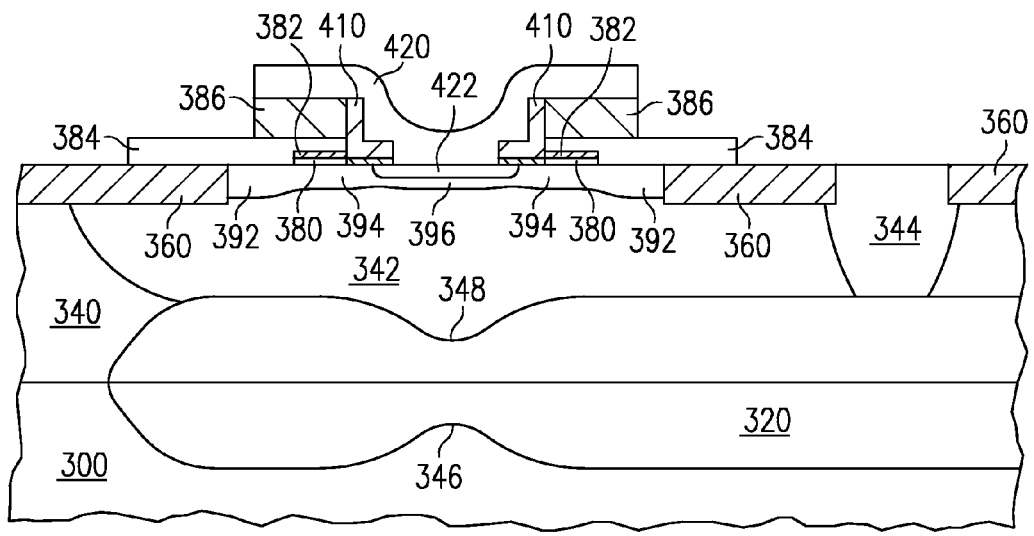

A process for fabricating a bipolar transistor in accordance with the invention is shown in FIGS. 3a to 3n. In FIG. 3a a semiconductor body 300, e.g. an epitaxial layer with p-doping, is shown after an implant step to form buried layer diffusion source regions 310 at the surface of the body. The ion implantation is performed with arsenic or similar dopant at a dose of about 6E15 ions/cm$^2$ at about 40 keV. The implantation mask 312 is photoresist having a thickness of about 1 um. The implant depth is about 50 nm. An alternative mask is a hardmask of silicon oxide with a thickness of about 800 nm. The oxide may be capped with a nitride of about 100 nm in thickness. The masked portion 314 of semiconductor body 300 is the ultimate location of the emitter and intrinsic base regions of the transistor. The portion of photoresist 312 covering this region is approximately 0.5 um in width.

FIG. 3b shows semiconductor body 300 following the removing of the photoresist 312 and following a high temperature anneal to diffuse the dopants both vertically and laterally within the semiconductor body. The diffusion anneal is performed at, for example, 1000° C. for approximately four hours. The depth of resulting buried layer 320 is about 500 nm. The lateral diffusion of dopants results in an overlapping of the two diffused regions. The overlap region 322 is about half the depth of the fully vertically diffused portions of region 320. Note that the ratio of overlap region thickness to fully vertically diffused region thickness is subject to the width of masked portion 314 in FIG. 3a, the diffusivity of the dopant, and the conditions used for the diffusion anneal. The preferred depth ratio of the overlap and fully vertically diffused regions in this embodiment is about one-half. The preferred depth ratio will typically fall within a range of about 0.3 to 0.6, but may be outside of this range depending upon the mean change in BVceo desired.

FIG. 3c shows the structure following the deposition of a second p-epitaxial layer 340 having a thickness on the order of 0.75 to 1.50 um. The surface of epitaxial layer 340 is patterned with photoresist or an oxide/nitride hardmask (not shown) and an implant is performed in preparation for the formation of n-well 342. The n-well implant may be performed by two implants using phosphorous, for example, at a dose of about 1E12 ions/cm$^2$ at about 70 keV, followed by a dose of about 1.2E12 ions/cm$^2$ at about 350 keV. Deep collector contact region is similarly formed with a phosphorous implant at a dose of 5E15 to 2E16 ions/cm$^2$ at about 150 keV. Following the n-well and collector contact implants, the dopants are driven with an anneal at about 1000° C. for about 150 minutes. This anneal also drives dopants in the buried layer into epitaxial layer 340 as shown in FIG. 3c. The indentation 346 in the buried layer profile is replicated as indentation 348 in the portion of the buried layer 320 that now lies in epitaxial layer 340.

Indentation 348 may be used advantageously to form a transistor with a relatively high BVceo using a process that is also capable of producing a transistor with a high cutoff frequency. The fabrication process described above, excluding the portion of masking layer 312 over masked portion 314, may be used to produce a transistor having high $f_T$. Consequently, the process is capable of producing both high breakdown voltage transistors and transistors with good high frequency performance. This may be done with no additional process cost, since the only difference in the fabrication processes of the two types of transistor is the masking layer 312 over masked portion 314. Masking layer 312 is used for both types of transistor to define the outer boundaries of the buried layer 320. The process for fabricating the high BVceo transistor simply relies on a different masking pattern for the buried layer implant shown in FIG. 3a.

Following the diffusion of the n-well, buried layer, and collector contact, shallow trench isolation regions 360 are formed at the surface of the structure. Note that alternative isolation techniques such as the local oxidation of silicon (LOCOS) and deep trench isolation may also be applied. Regions 360 are formed by etching shallow trenches at the surface of layer 340 and filling the trenches with a high density plasma deposited oxide. The thickness of the isolation trenches is about 670 nm.

The fabrication process for the embodiment transistor is shown here to incorporate a stacked barrier-diffusion source base link approach as described in co-assigned U.S. Pat. No. 5,502,330 issued Mar. 26, 1996. Note that extrinsic base doping may alternatively be formed entirely from diffusion from the base electrode 384. Referring to FIG. 3e, a base-link diffusion source layer 380 is deposited over the structure of FIG. 3d to a thickness on the order of 50 nm. The base-link diffusion source layer 380 comprises a material that may be etched selectively with respect to silicon and that may function as a dopant source for a base link-up region to be formed later in the process. Base-link diffusion source layer 380 is preferably doped in situ or implant doped after deposition. For example, base-link diffusion source layer 380 may comprise borosilicate glass (BSG), phosphosilicate glass (PSG), or doped silicon germanium. The dopant concentration of base-link diffusion source layer 380 is determined by the desired resistance of the base link-up region to be subsequently formed.

A barrier layer 382 is deposited over base-link diffusion source layer 380 to a thickness in the range of 10 to 50 nm, but typically on the order of 30 nm. Barrier layer 382 comprises a material that protects layer 380 during subsequent processing steps such as clean-ups and photoresist strips. Barrier layer 382 preferably comprises a dielectric such as silicon oxide or silicon nitride. Layers 380 and 382 are then patterned and etched using, for example, an oversized replica of the emitter pattern. The desired etching chemistry for layer 380 is highly selective with respect to silicon. Suitable etch chemistries etch chemistries will be apparent to those skilled in the art.

Referring now to FIG. 3f, a first layer of polysilicon and an interpoly dielectric are deposited to a thickness on the order of 200 and 300 nm, respectively. The first layer of polysilicon may be doped in situ or implant doped after deposition to provide a low resistance layer. The first layer of polysilicon and the interpoly dielectric 386 are then etched as shown in FIG. 3f to form the base electrode 384. The interpoly dielectric etch stops on the polysilicon and the polysilicon etch stops on barrier layer 382 or base-link diffusion layer 380. As a result, the active or intrinsic region 388 of the transistor is protected from overetching and crystal damage. The base electrode 384 overlaps the ends of barrier layer 382 and base-link diffusion source layer 380. The amount of overlap varies by design, but may be on the order of 0.2 um. The pattern for layers 380 and 382 may overlap isolation regions 360 on one or more sides to reduce device active area. This leaves contact to the base region on less than four sides.

The exposed portion of barrier layer 382 and underlying base-link diffusion source layer 380 are then removed as shown in FIG. 3g. A selective dry etch, for example, that is highly selective to silicon may be used. This avoids damage to the transistor active area such as that which occurs when etching polysilicon directly off of silicon. This step is followed by an anneal cycle used to grow a screen oxide 390, while simultaneously diffusing the extrinsic base region 392 from the base electrode 384 and the base link-up region 394 from the remaining portions of base-link diffusion source layer 380 as shown in FIG. 3h. Because base link-up region 394 is diffused from base-link diffusion source layer 380, the dopant concentration of base link diffusion source layer 380 is adjusted to provide a low resistance base link-up region 394 without substantially affecting the resistance of base electrode 384. The surface concentration of dopant at the interface is preferably on the order of 5E19 atoms/cm$^3$. Referring to FIG. 3i, intrinsic base region 396 is implanted through screen oxide 390 and diffused.

The following several steps describe the formation of base-emitter spacers whose function it is to separate the edges of a subsequently formed emitter region from the edges of intrinsic base region 396. The edges of intrinsic base region 396 are coincident with the edges of the stack comprising polysilicon base electrode 384 and dielectric 386. The procedure depicted beginning in FIG. 3j results in an L-shaped spacer, as opposed to a dielectric sidewall as shown in aforementioned U.S. Pat. No. 5,502,330. As mentioned above, spacers are used to separate the emitter from the base in the transistor. However, typical $Si_3N_4$ base-emitter spacers result in emitter polysilicon depositions on the spacer sidewall that extend over the active emitter area, blocking a portion of the emitter dopant implant into the polysilicon directly over the emitter diffusion area. In addition, the resulting reduction in planar polysilicon area over the emitter can cause a high variability in the resistance of the emitter contacts formed in this region. L-shaped spacers, on the other hand, consume less volume and allow the implantation of dopants into the emitter polysilicon directly over the emitter region. The result is a uniform and consistent emitter junction depth and a reliable and low resistance emitter contact, regardless of patterned emitter size.

Referring to FIG. 3j, a layer of silicon nitride 402 having a thickness of about 70 nm is deposited to conformally cover the surface of the structure. The nitride layer 402 may be deposited with a low pressure chemical vapor deposition method, plasma enhanced chemical vapor deposition method, or similar suitable technique. The nitride layer is then covered with a material 404 having a good anisotropic etch selectivity to nitride and a high isotropic etch selectivity to oxide. The anisotropic etch selectivity ratio of material 404 to the nitride layer should be at least about 2:1, and the isotropic etch selectivity to oxide should be at least about 5:1. Examples of such materials include phosphorous-containing materials such as PSG or borophosphosilicate glass (BPSG). Using a material for layer 404 that is less etch-selective to oxide and nitride incurs the risk that the active area of the epitaxial layer 340 will be etched during the subsequent removal of portions of layers 400, 402, and 404 in the dry etching steps. Another risk is that removal of portions of layer 404 will not be complete during the simultaneous removal of that layer and thermal oxide layer 390 during the wet deglaze etching unless layer 404 etches at a substantially higher rate than does layer 390.

In FIG. 3k, layer 404 has been anisotropically dry-etched to produce the sacrificial sidewalls 409 that ultimately define the emitter region diffusion width. The anisotropic etching may be achieved with reactive ion etching, for example, using an etch chemistry comprising $CHF_3:O_2$. The selectivity of the etching of layer 404 to the nitride layer 402 is important as a high degree of selectivity reduces the area dependence of the etch, the importance of overetch time selection, and trenching. Prior art techniques rely on silicon oxide deposited through the decomposition of tetraethyloxysilane (TEOS) for layer 404. However, TEOS oxide is not entirely conformal to the underlying nitride. This often results in there being less TEOS oxide over the emitter region than over the remainder of the structure. Consequently, the TEOS oxide overetches and forms trenches in the emitter region during the etch to clear the TEOS oxide remaining on the remainder of the structure. The TEOS oxide overetch then leads to overetching of the nitride in the emitter region since the nitride is thinned by the overetch of the TEOS oxide. This is a particular problem since the etch selectivity of TEOS oxide to nitride is only about 1.5:1. The tendency to combat this problem is to rely on a thick (about 150 nm) nitride layer 402. The problem with that approach, however, is that a thicker spacer is produced, reducing the area for dopant implantation directly above the emitter and resulting in narrow emitter effects.

In contrast, the dry-etch selectivity of PSG and BPSG to nitride is approximately twice that of TEOS oxide. This allows the use of a thinner nitride layer 402 to produce a thinner spacer, while still providing protection against the overetching of underlying layers.

In FIG. 3l, the portions of nitride layer 402 not covered by the PSG or BPSG sacrificial sidewalls 409 are removed with a reactive ion etching process using a chemistry comprising $CF_4:CHF_3:O_2$, for example. The nitride etch stops on the thermal oxide layer 390. The resulting structure is an L-shaped nitride spacer still covered by the PSG or BPSG sidewalls 409. The sidewalls 409 and the thermal oxide layer 390 that covers the intrinsic base region 396, and subsequently the emitter region, are then removed in a deglaze (wet etching) step using a 10% HF, for example.

The prior art use of TEOS oxide for layer 404 again makes these steps difficult. The wet etch rate ratio of TEOS oxide to thermal oxide is only about 2:1. Thus, when the thermal oxide layer 390 is removed in the deglaze step, not all of the TEOS is removed because of the large difference in thickness between thermal oxide layer 390 and the sacrificial TEOS sidewalls that cover the nitride. Thus, the prior art approach risks either leaving TEOS on the nitride after the deglaze step, or overetching the thermal oxide to ensure that the TEOS is cleared from the nitride. Leaving TEOS on the nitride spacer is undesirable because of the narrow emitter effects that can result from a thick spacer. Overetching the thermal oxide 390 is undesirable because some of layer 412 can be removed, resulting in an exposed base-emitter junction. The exposed base-emitter junction may fill with emitter poly and result in a leaky base-emitter junction.

In contrast, the use of PSG or BPSG, both of which have an etch rate ratio to thermal oxide approximately five times that of TEOS oxide, allows complete removal of the sacrificial sidewalls 409 from the nitride 402 without substantially overetching the thermal oxide 390. The resulting structure is shown in FIG. 3m. The base-emitter spacers comprise a nitride "L" 410 that remains of layer 402, and the underlying thermal oxide 412 that remains of the layer 390.

The emitter of the transistor is formed by depositing a second layer of polysilicon to a thickness on the order of 250 nm. The second polysilicon layer may be doped in-situ or implant doped after deposition. The preferred method is implant doping of arsenic with a dose of about $1E16$ ions/cm$^2$ at about 100 keV. The second polysilicon layer is then patterned and etched to form emitter electrode 420. Emitter region 422 is diffused approximately 40 nm into the surface of epitaxial layer 340 from the emitter electrode 420 by rapid thermal annealing at about 1050° C. for about 10 seconds. This diffusion may alternatively be done prior to the etching of the second polysilicon layer to form the emitter electrode.

Figure 4:
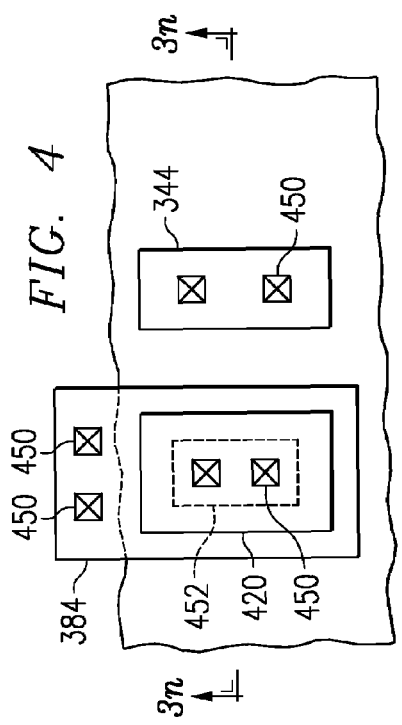
FIG. 4 is a plan view of the embodiment transistor shown in FIG. 3n.

FIG. 4 is a plan view of the transistor shown in cross-section in FIG. 3n. The emitter electrode 420 and base electrode 384, as well as the collector contact 344 are shown with representative contact points 450 indicated. Element 452 is the inside boundary of the L-shaped spacer. A low resistance contact is achieved by siliciding the polysilicon electrode or silicon contact. Multilevel metallization may be used in a conventional manner to couple the transistor to other circuits.

Figure 5:
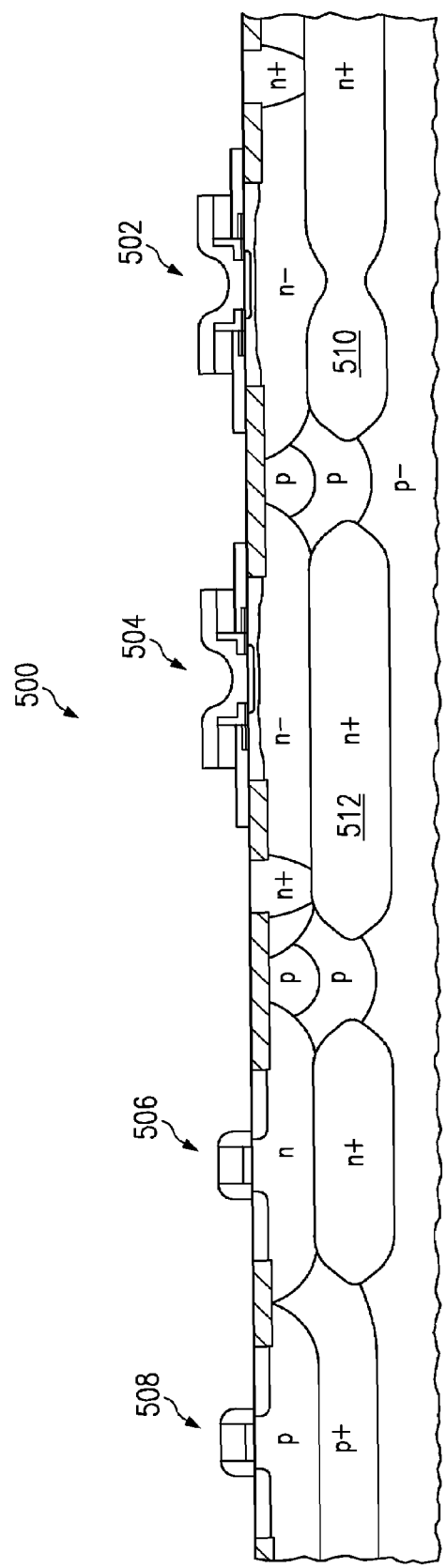
FIG. 5 is a cross-sectional diagram of an integrated circuit comprising the embodiment transistor of FIG. 3n as well as a conventional bipolar transistor and CMOS p-channel and n-channel transistors.

FIG. 5 shows a BiCMOS implementation 500 in which the transistor 502 of FIG. 3n is integrated with a bipolar transistor 504 having a conventional buried layer, a CMOS p-channel transistor 506, and a CMOS n-channel transistor 508. Transistor 502 has relatively high breakdown characteristics due to the indentation in the buried layer 510. In contrast, transistor 504 has a relatively high cutoff frequency, $f_T$, due to its uniform buried layer 512.

While this invention has been described with reference to illustrative embodiments, this description is not intended to be construed in a limiting sense. For example, the invention was described with reference to a double polysilicon bipolar transistor formed using a BiCMOS process. It will be apparent to those skilled in the art that the innovations are also applicable to other BiCMOS processes and devices, as well as to bipolar processes and devices. Various modifications and combinations of the illustrative embodiments, as well as other embodiments of the invention, will be apparent to persons skilled in the art upon reference to the description. It is therefore intended that the appended claims encompass any such modifications or embodiments. The circuits and devices described herein may be implemented in silicon-based integrated circuits or in compound semiconductor integrated circuits.

What is claimed is:

1. A method for making a transistor, comprising the steps of:
    masking the surface of a semiconductor body to cover regions of said surface;
    doping unmasked regions of said surface to form a plurality of spaced apart diffusion source regions;
    diffusing dopants from said diffusion source regions to cause said diffusion source regions to combine with each other and form a single doped buried region having portions of said single doped buried region having a first thickness and portions of said single doped buried region having a second thickness, said first thickness less than said second thickness;
    forming an electron collecting region over said doped buried region;
    forming an electron control region within said electron collecting region; and
    forming an electron emitting region within said electron control region;
    each of said electron collecting region, said electron control region and said electron emitting region having a portion disposed over said buried region having said first thickness and at least a portion of said electron control region extending over said portion having said second thickness,
    wherein said buried region having said first thickness is a diffusion-overlapping region.

2. The method of claim 1, wherein said second thickness is about twice the first thickness.

3. A method for making an integrated circuit, comprising the steps of:
    forming a first transistor by:
        forming a first doped buried region within a semiconductor body, said first doped buried region including a portion having a first thickness and a portion having a second thickness, said first thickness being less than said second thickness;
        forming a first electron collecting region disposed over said first doped buried region of said first thickness;
        forming a first electron control region within said first electron collecting region; and forming a first electron emitting region within said electron control region;

each of said first electron collecting region, said first electron control region and said first electron emitting region having a portion disposed over said buried region having said first thickness and at least a portion of said first electron control region extending over said portion having said second thickness, wherein said buried region having said first thickness is a diffusion-overlapping region; and forming a second transistor by:

forming a second doped buried region within said semiconductor body, said second doped buried region being substantially uniform in thickness;

forming a second electron collecting region over said second buried region;

forming a second electron control region within said second electron collecting region; and forming a second electron emitting region within said second electron control region.

4. The method of claim 3, wherein said first thickness is about half the second thickness.

5. The method of claim 4 wherein said first buried region and said second buried region are spaced apart.

6. The method of claim 3, further including forming as part of said integrated circuit third and fourth transistors, one an n-channel transistor and the other a p-channel MOS field-effect transistor.

7. The method of claim 6 wherein said first buffed region and said second buffed region are spaced apart.

8. The method of claim 3 wherein said first buried region and said second buried region are spaced apart.

* * * * *